United States Patent [19]

Kelly et al.

[11] 3,999,085
[45] Dec. 21, 1976

[54] NOISE REJECTION CIRCUIT

[75] Inventors: Patrick M. Kelly, Victor; Stanley L. Russell, West Webster, both of N.Y.

[73] Assignee: Stromberg-Carlson Corporation, Rochester, N.Y.

[22] Filed: July 14, 1975

[21] Appl. No.: 595,552

[52] U.S. Cl. .......................... 307/247 A; 328/164; 328/207

[51] Int. Cl.² .......................... 328 195; H03K 5/18

[58] Field of Search .......... 307/247 A, 247 R, 268; 328/162, 164, 165, 207, 195; 340/365 E; 178/69 R, 70 R

[56] References Cited
UNITED STATES PATENTS

| | | | |
|---|---|---|---|
| 3,195,056 | 7/1965 | Trautwein | 328/165 |
| 3,820,031 | 6/1974 | Smithlin | 307/268 |
| 3,925,682 | 12/1975 | Hamada | 307/247 A |

*Primary Examiner*—Stanley D. Miller, Jr.
*Assistant Examiner*—Marcus S. Rasco
*Attorney, Agent, or Firm*—Hoffman Stone; William F. Porter, Jr.

[57] ABSTRACT

A digital interface especially useful for isolating a speedily responsive circuit from the effects of transients at its input such as may be caused, for example, by contact bounce in a relay. The circuit includes a monostable multivibrator connected to be set in response to changes of alternately opposite polarity of the input signal and having a characteristic period equal to a predetermined fraction of the normal minimum interval between intended changes of the input signal. The output of the multivibrator is used to drive a flip-flop at the end of the characteristic period to produce the desired output signal. Thus, the circuit is non-responsive to relatively rapid alternations of the input signal immediately following a change of its condition, yet responds reliably when the input signal changes state and remains stable in its new state for a time exceeding the characteristic period of the multivibrator.

2 Claims, 5 Drawing Figures

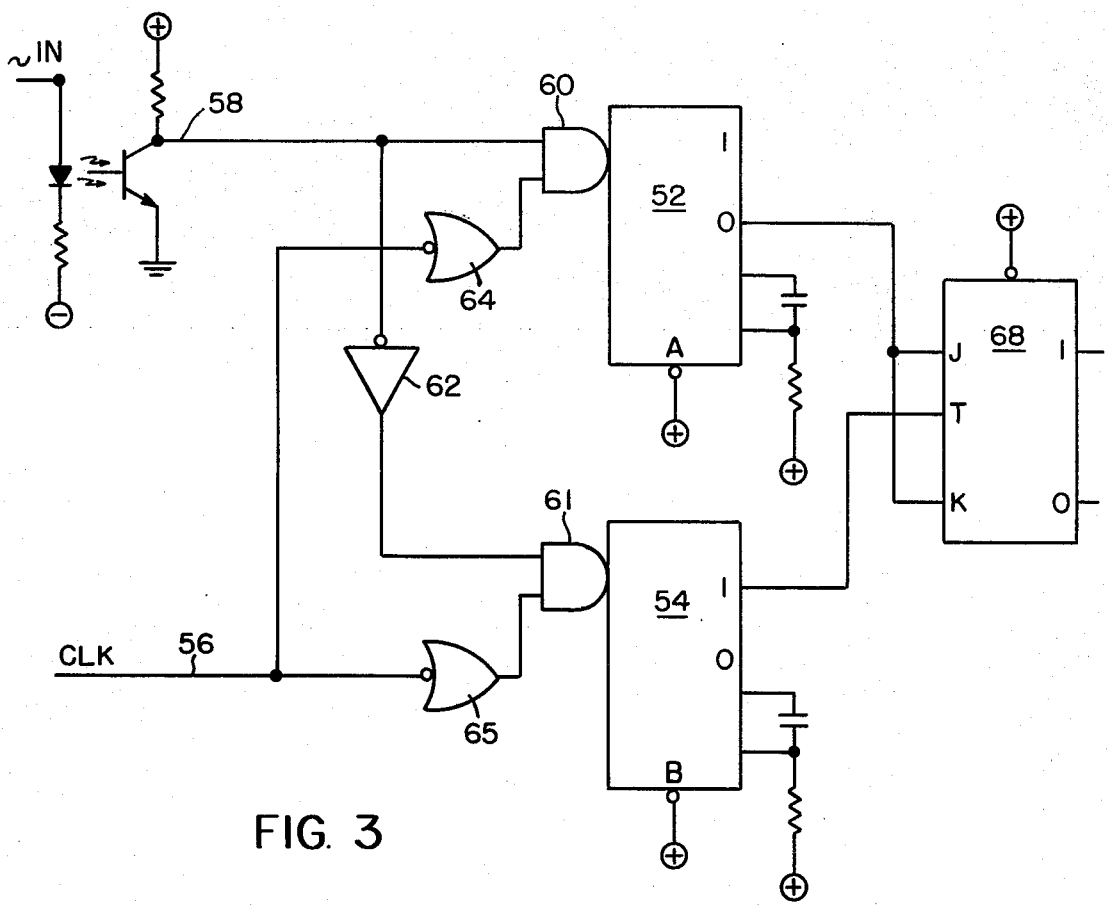
FIG. 3
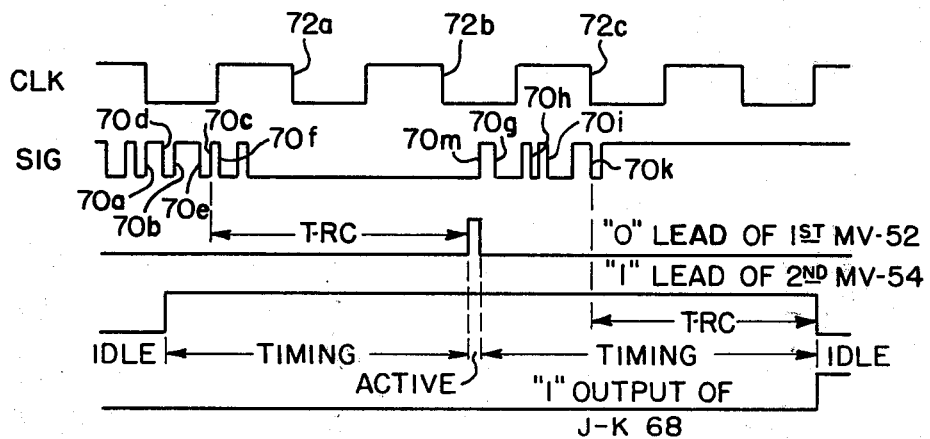
FIG. 4
| MV 52 | MV 54 | |
|---|---|---|
| 0 | 0 | —— ALARM |
| 1 | 0 | —— IDLE |
| 0 | 1 | —— ACTIVE STATE |
| 1 | 1 | —— TIMING STATE |
FIG. 5

NOISE REJECTION CIRCUIT

BRIEF DESCRIPTION

This invention relates to a novel, and relatively simple circuit for rejecting so-called noise from a digital input signal and producing a digital output signal that is equivalent to the input signal as originally intended.

The circuit may be asynchronous, that is, not timed by a separate clock but by the incoming signal itself, as in the first embodiment described hereinbelow, or it may be synchronous if a suitable clock is available. In both cases, the circuit is very simple, yet reliable and highly effective. In the asynchronous embodiment it includes a monostable multivibrator arranged to be triggered to its set condition in response to changes of alternately opposite polarity of the input signal, and having a characteristic period equal to a predetermined fraction of the normal minimum interval between changes of the input signal. If several changes of the input signal occur in rapid succession, each one that is of the polarity indicating a new level of the input signal triggers the multivibrator to re-start its timeout. Once the input signal has stabilized at its new level the multivibrator times out, and, at the end of its period triggers a flip-flop to produce an output signal for delivery to a utilization circuit or device. Thus, noise such as may be caused, for example, by contact bounce of a relay at the point of origin of the signals is effectively rejected and is not transmitted to the utilization circuit or device.

A slightly more complex timing arrangement is used when a clock signal is available and it is desired to synchronize the output signals with the clock. Two monostable multivibrators are used in a coupled arrangement with one responsive to high-going changes of the input signal and the other to low-going changes, both during times when the clock signal is at a predetermined level. The clock is selected so that its period is not greater than two thirds the duration of the time-out period of the multivibrators. Both of the multivibrators are set, and may be repeatedly set, in response to noise at the input at the beginning of an intended low period of the input signal. The noise, which occurs during a relatively short interval following the start of each half cycle of the input signal is suppressed by the blocking effect of the multivibrators, the outputs of which constitute the noise-free output signal, or signals.

One important advantage of the circuit is that it has a so-called single-ended input, in contrast to many circuits of the prior art that require two inputs and rely on complementary signalling and comparison schemes.

DETAILED DESCRIPTION

Representative embodiments of the invention will now be described in connection with the drawings, wherein:

FIG. 3 is a schematic circuit diagram of a synchronous noise rejection circuit according to a modified form of the invention;

FIG. 4 is a hypothetical timing diagram for the circuit shown in FIG. 3; and

FIG. 5 is a truth table for the circuit shown in FIG. 3.

Figure 1:
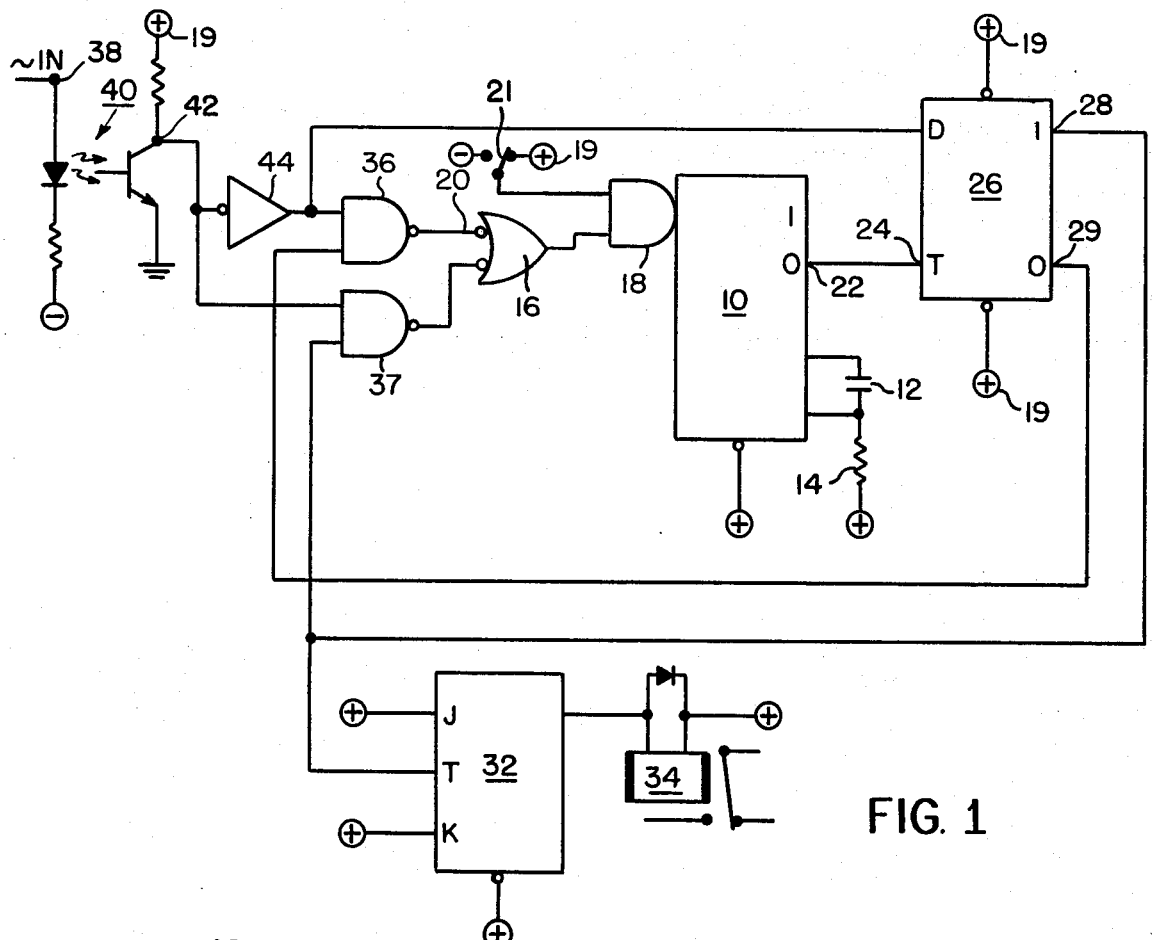
FIG. 1 is a schematic diagram of an asynchronous noise rejection circuit according to a presently preferred embodiment of the invention.

As shown in FIG. 1, the asynchronous circuit includes a monostable multivibrator 10 which may be of the type commercially designated 74123, with its timeout period controlled by a capacitor 12 and a resistor 14 connected to its time control terminals (not separately designated). An OR type invertor 16 and an AND gate 18 are included on the same IC chip with the multivibrator 10. The output of the invertor 16 is internally connected to one input of the AND gate 18, and the other input of the AND gate 18 is normally connected to the high battery terminal 19. If desired, switching means indicated schematically by the simple switch 21 may be included for selectively switching the input of the gate 18 from the high to the low battery terminal to inhibit the circuit.

The characteristic of the multivibrator 10 is that it is triggered to its fully set condition in response to a change from low to high at the output of the AND gate 18, and becomes fully set upon the occurrence of that change regardless of the time since its last previous setting. If, therefore, the condition at the output of the gate 18 changes from low to high at intervals shorter than the time-out interval the multivibrator remains in its set condition and times out its full characteristic period following the last of the series of changes.

The changes of state at the outputs of the multivibrator 10 at time-out constitute noise-free signals corresponding to the intended input signal but at twice the rate. To produce a noise-free output at the same rate as the input signal, one output of the multivibrator 10 is used to drive a flip-flop 26 as described hereinafter, the output of which constitutes the regenerated output signal.

It is also desired to control the input to the multivibrator responsively to the momentary state of the input signal so that once the input signal is stabilized in its low state the multivibrator becomes responsive to high-going changes, and once the signal is stabilized in its high state the multivibrator responds to low-going changes.

In the illustrated embodiment this is done through a D-type flip-flop 26, the toggle terminal of which is connected to the "0" output terminal 22 of the multivibrator 10. This output terminal 22 is at a logic 1 when the miltivibrator is in its reset, or normal condition, that is, following time-out. It is at a logic 0 while the multivibrator is in its set condition, that is, during time-out. The output signal of the multivibrator is applied to the toggle terminal 24 of the flip-flop 26, which may be of the type commercially designated 7474, to trigger it whenever the multivibrator times out, that is, each time the condition at the common terminals 22 and 24 changes from 0 to 1.

The inverted input signal is applied from an invertor 44 to the D terminal of the flip-flop. The characteristic of the flip-flop 26 is that a high-going change at its toggle terminal causes its "1" output terminal to assume the same state that then exists at it D input terminal. At time-out, the output terminal 22 of the multivibrator changes from low to high. If the time-out occurs at a time when the input signal is low, the D terminal of the flip-flop is high and the 1 terminal changes to high. The next succeeding time-out occurs when the input signal is high and the D terminal low, so the 1 terminal reverts to its low state.

Either of the outputs 28 and 29 of the flip-flop may be taken as the output signal of the circuit for utilization by any desired circuit or device. The changes of condition at these terminals are at the same rate as the changes of the intended input signal. In the embodiment illustrated, the 1 output 28 is used to trigger a divide-by-two flip-flop 32, which may be of the type commercially designated 7473, and which actuates a relay 34 to operate a device such as, for example, a peg counter (not shown).

The outputs of the signal generating flip-flop 26 are also used selectively to enable and inhibit a pair of NAND gates 36 and 37 that are connected with their outputs commoned through the invertor 16 to the input of the gate 18. The main input terminal 38 of the circuit may be electrically isolated from the rest of the circuit by the LED-transistor coupler 40 shown, in which case the input signal is regarded as appearing at the collector 42 of the transistor. It is applied to the first input gate 36 through an invertor 44, and directly to the second input gate 37.

The gates 36 and 37, controlled by the flip-flop 26, together with the invertor 44 serve to make the monostable multivibrator respond alternately to opposite respective changes of the input signal. The outputs of the flip-flop 26 are always opposite from each other so only one of the gates 36 and 37 is enabled at any one time. During times when one of the gates 36 and 37 is enabled, the multivibrator is set by low-going changes at the input terminal 42, and when the other one is enabled the multivibrator is set by high-going changes.

Figure 2:
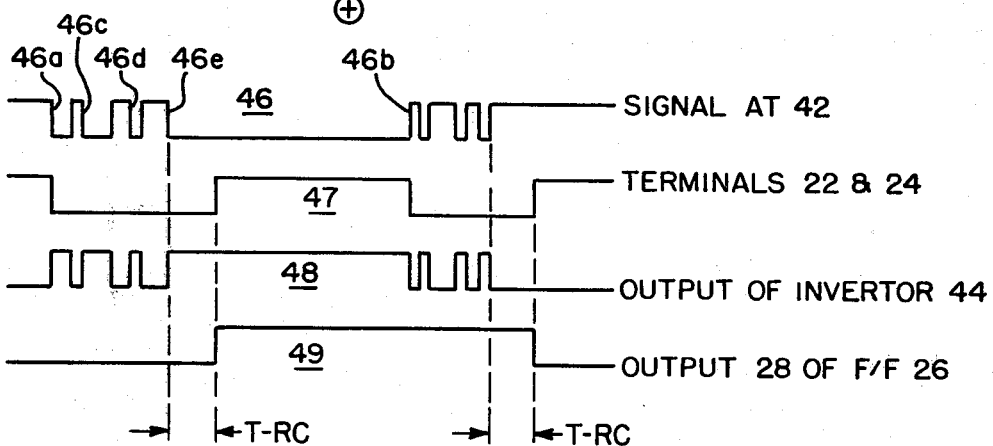
FIG. 2 is a hypothetical timing diagram for the circuit shown in FIG. 1.

FIG. 2 is a hypothetical timing diagram for the circuit shown in FIG. 1. The top curve 46 indicates voltage changes that might occur at the input terminal 42 as a function of time. The low-going change 46a marks the beginning of an intended low voltage period, while the high-going change 46b indicates the beginning of an intended high voltage period immediately following the low voltage one. Because of contact bounce of other effects, however, the input terminal 42 may change state several times immediately after the start of each period, so that, for example, there may be three additional low-going changes 46c, 46d, and 46e following the initial low-going change 46a. Each one of the low-going changes 46a, 46c, 46d, and 46e, sets the multivibrator 10. The output of the multivibrator 10 at its 0 terminal 22 is shown as the second curve 47. The multivibrator 10 does not time out until the end of its characteristic period timed from the last one 46e of the low-going changes.

The third curve 48 indicates the changes at the D input of the flip-flop 26, the inverse of the changes at the input terminal 42. And the bottom curve 49 indicates the changes at the 1 output terminal of the flip-flop 26.

The action in response to a high-going change of the input signal is exactly analogous as can readily be seen.

A synchronous circuit according to a modified form of the invention is shown in FIG. 3. It includes two monostable multivibrators 52 and 54, respectively, which may be exactly similar to the multivibrator 10 in the asynchronous circuit of FIG. 1. The time-out periods of the multivibrators are, as in the first embodiment, calculated to be longer than the typical noise pulses in the input signal, and the clock 56 is selected as one having a half-period at most one third the duration of the time-out period of the multivibrators 52 and 54. The input signal from the terminal 58 is applied to one input of the AND gate 60 of the first multivibrator, and through an invertor 62 to the corresponding input of the AND gate 61 of the second multivibrator 54. The clock 56 is applied directly to the inputs of the invertors 64 and 65 at the inputs of the multivibrators. The outputs of the multivibrators 52 and 54 constitute the output signal of the circuit and may be delivered to any desired logic circuit for utilization in accordance with the truth table shown in FIG. 5.

In the circuit as shown the 0 output of the first multivibrator 52 is connected to the J and K terminals of a divide-by-two flip-flop 68, which is of the J-K, MASTER-SLAVE type commercially designated 7473 and the "1" output of the second multivibrator 54 is applied to the toggle terminal of the flip-flop 68. The flip-flop 68 changes its output condition upon the completion of each complete cycle of the input signal, thereby generating a signal at one-half the rate of the input.

The mode of operation of the circuit will be explained in connection with its timing diagram shown in FIG. 4. The multivibrators 52 and 54 become set only upon high-going changes at the outputs of their respective AND gates 60 and 61. They can, therefore, be set responsively to changes in the input signal only when the clock is in its low state. Similarly, the first multivibrator 52 can be set by changes of the clock only during times when the input signal is high, and the second multivibrator can be set by changes of the clock only when the input signal is low.

In the hypothetical instance shown the first multivibrator 52 is set by each of the three high-going changes 70a, 70b, and 70c of the input signal that occur during the first low period of the clock. The second multivibrator 54 is set by the three low-going changes 70d, 70e, and 70f, of the input signal during the same period. Following the first low period of the clock the input signal becomes stabilized in its low condition and the second multivibrator 54 is set upon each low-going change 72a, 72b, and 72c of the clock that occurs while the input signal is low. The first multivibrator 52 times out following the last of the high-going changes 70c that set it, and, in the instance shown is quickly set again by the high-going change 70m of the input signal. The second multivibrator 54 times out following the last low-going changes 70k and 72c of the input and clock signals, which are assumed here to occur practically simultaneously.

During times when the input signal is high, the clock sets the first multivibrator on each of its high-going changes, and while the input signal is low the clock sets the second multivibrator 54 on each of its low-going changes. Time-out of the first multivibrator 52 operates to prime the J-K flip-flop 68 so that when the second multivibrator 54 times out, producing a low-going change at the toggle input of the flip-flop 68, the output of the flip-flop 68 reverses its condition.

The first multivibrator 52 may be regarded as normally held set. It times out only during times when the input signal is low. The second multivibrator 54 is repeatedly set by the clock during times when the input signal is low, and times out after the input signal has stabilized in its high condition. The output of the flip-flop 68 changes only in response to time-out of the second multivibrator 54 subsequent to time-out of the first one 52. Thus, the output signal is at one half the frequency of the input signal.

The truth diagram of FIG. 5 relates to corresponding output terminals, the so-called 1 terminals, of the multivibrators 52 and 54, whereas the timing diagram relates to the circuit as used to drive the divide-by-two flip-flop 68 in which different outputs are taken from the respective multivibrators. As shown, if the 1 output terminals of both of the multivibrators are low, an alarm condition exists, meaning that something is wrong with the circuit. If the 1 terminal of the first multivibrator 52 is high, and that of the second is low, the circuit is in its idle condition, the input signal is high and the circuit is waiting for it to change to its low state. When the 1 terminal of the first multivibrator is low, and that of the second is high, the circuit is in its active state, having started to time the duration of a low condition of the input signal. And, when the 1 terminals of both the multivibrators 52 and 54 are high, the circuit is said to be in its timing state, that is, the input signal has gone back to its high state and the second multivibrator is timing out, blocking the passage of the so-called noise from the input signal at the beginning of its high state period, and preparing to trigger the flip-flop 68.

Any of many different circuit arrangements may be designed on the basis of the truth diagram for utilizing the outputs of the multivibrators 52 and 54 depending upon the requirements of the particular instances.

What is claimed is:

1. A synchronous regenerative noise rejection circuit for generating a generally noise-free digital signal in response to a digital input signal that may include several reversals of condition during an initial fractional portion of the normal minimum intended duration of each of its conditions, said circuit comprising:
   a. a pair of monostable multivibrators having characteristic periods equal to a predetermined fractional portion of the minimum intended duration of each condition of the input signal,
   b. a pair of AND gates having their outputs connected respectively to the SET inputs of said multivibrators,
   c. input means for applying the input signal to respective inputs of said AND gates, directly to one and inversely to the other,
   d. means for producing a clock signal having a period not longer than two-thirds the characteristic periods of said multivibrators,
   e. means for applying the clock signal produced by said producing means to separate respective inputs of said AND gates, both in the same phase, and
   f. output means for utilizing at least one output of said multivibrators.

2. A regenerative noise rejection circuit for generating a generally noise-free digital signal in response to a digital input signal that may include several reversals of condition during an initial fractional portion of the normal minimum intended duration of each of its conditions, said circuit comprising:
   a. a monostable multivibrator having a time-out period equal to a predetermined fractional portion of the minimum intended duration of each condition of the input signal,
   b. means including an invertor and a pair of logic gates for applying input signal to the SET terminal of said multivibrator alternately directly and inversely, the input signal being applied to one of said gates directly and to the other one through said invertor, the outputs of said gates being connected to the SET terminal of said multivibrator, and
   c. a flip-flop having an input connected to an output of said multivibrator and its outputs connected separately to inputs of said gates for selectively enabling and inhibiting said gates alternately so that upon time-out of said multivibrator when the input is high the inverse of the input signal is applied to said mutivibrator, and upon time-out when the input signal is low the direct input signal is applied to the multivibrator, an output of the multivibrator constituting a noise-free signal at twice the rate of the input signal, and an output of said flip-flop constituting a noise-free signal at the same rate as the input signal.

* * * * *